US009057907B2

(12) United States Patent
Kim et al.

(10) Patent No.: US 9,057,907 B2
(45) Date of Patent: *Jun. 16, 2015

(54) MASK FOR BLACK MATRIX

(75) Inventors: Jin-Pil Kim, Paju-si (KR); Seung-Ryull Park, Goyang-si (KR); So-Young Noh, Seoul (KR); Jin-Bok Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 353 days.

This patent is subject to a terminal disclaimer.

(21) Appl. No.: 13/304,020

(22) Filed: Nov. 23, 2011

(65) Prior Publication Data

US 2012/0268813 A1 Oct. 25, 2012

(30) Foreign Application Priority Data

Apr. 21, 2011 (KR) ........................ 10-2011-0037375

(51) Int. Cl.
*G02F 1/1333* (2006.01)
*G02F 1/1343* (2006.01)
*G03F 1/00* (2012.01)
*G06F 17/50* (2006.01)
*G02F 1/1335* (2006.01)
*G03F 1/36* (2012.01)
*G03F 7/20* (2006.01)

(52) U.S. Cl.
CPC ............ *G02F 1/133512* (2013.01); *G03F 1/36* (2013.01); *G03F 1/144* (2013.01); *G03F 7/70441* (2013.01); *G02F 2001/134372* (2013.01)

(58) Field of Classification Search
CPC ...... B82Y 20/00; G02B 6/1226; G02B 5/008; G02B 5/1809; G02F 1/0147
USPC .......................... 349/141, 110; 430/5; 716/53
See application file for complete search history.

(56) References Cited

U.S. PATENT DOCUMENTS

| 6,080,527 | A  | * | 6/2000  | Huang et al. ................... 430/296 |
| 6,335,130 | B1 | * | 1/2002  | Chen et al. ......................... 430/5 |
| 7,010,764 | B2 | * | 3/2006  | Pierrat .............................. 716/53 |
| 7,055,127 | B2 | * | 5/2006  | Pierrat et al. .................... 716/53 |
| 8,228,478 | B2 | * | 7/2012  | Maede et al. .................. 349/143 |
| 8,551,674 | B2 | * | 10/2013 | Noh et al. .......................... 430/5 |
| 2007/0052900 | A1 | * | 3/2007 | Cho et al. ....................... 349/141 |
| 2009/0109364 | A1 | * | 4/2009 | Yang et al. ...................... 349/46 |
| 2010/0123843 | A1 | * | 5/2010 | Kim et al. ....................... 349/39 |

\* cited by examiner

*Primary Examiner* — Robert Tavlykaev
(74) *Attorney, Agent, or Firm* — Brinks Gilson & Lione

(57) ABSTRACT

A mask for forming a black matrix for a display device that includes a data line having a bending structure with respect to a central portion of a pixel region includes a edge frame having a rectangular shape, and a base plate disposed on the edge frame and including a light-transmitting portion and a light-blocking portion, wherein the light-transmitting portion includes first light-transmitting patterns and light-controlling portions between adjacent first light-transmitting patterns, and the light-transmitting portion further includes a bending portion corresponding to the central portion of the pixel region, and wherein the bending portion is disposed with a same distance from the light-transmitting patterns adjacent thereto.

9 Claims, 17 Drawing Sheets

MASK FOR BLACK MATRIX

This application claims the benefit of Korea Patent Application No. 10-2011-0037375, filed on Apr. 21, 2011, the entire contents of which is incorporated herein by reference for all purposes as if fully set forth herein.

BACKGROUND

1. Field of the Invention

The present disclosure relates to a mask for forming a black matrix for a display device including a data line having a bending structure with respect to a central portion of a pixel region.

2. Discussion of the Related Art

With rapid development of information technologies, display devices for displaying a large amount of information have been promptly developed. More particularly, flat panel display (FPD) devices having a thin profile, light weight and low power consumption such as organic electroluminescent display (OLED) devices and liquid crystal display (LCD) devices have been actively pursued and have been replacing the cathode ray tubes (CRTs).

Among the various types of FPD devices, liquid crystal display (LCD) devices have been widely used as monitors for notebook computers and desktop computers because of their excellent contrast ratio, low power consumption and superiority in displaying moving images. The LCD device uses optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules.

Generally, an LCD device includes a liquid crystal panel, which comprises a first substrate having an array layer for driving liquid crystal molecules, a second substrate having a color filter layer for producing colors, and a liquid crystal layer therebetween. The arrangement of the liquid crystal molecules varies depending on an electric field, and transmittance of light passing through the liquid crystal panel is controlled.

The LCD device further includes a backlight under the liquid crystal panel. Light from the backlight passes through the liquid crystal panel, and a color image is displayed due to the color filter layer.

The LCD device may be manufactured through a substrate-fabricating process for forming elements on first and second substrates, a cell process for completing a liquid crystal panel, and a module process for combining the liquid crystal panel and a backlight.

The substrate-fabricating process includes a thin film deposition process, a photo-lithography process, an etching process, and so on, which are repeated several times, to form pixel electrodes and thin film transistors.

The photo-lithography process forms a photoresist pattern by applying photoresist to a substrate having a thin film, exposing the photoresist to light through a mask, and developing the photoresist.

An exposure apparatus for exposing the photoresist to light may be classified into a projection type and a proximate type. The projection type has a merit of a high resolution of the photoresist pattern and has demerits of high costs and a slow exposure speed as compared with the proximate type. Therefore, recently, the proximate type exposure apparatus has been widely used.

FIG. 1 is a plan view of illustrating a mask for forming a black matrix having a plurality of patterns according to the related art, and FIG. 2 is a plan view of illustrating a light-transmitting portion of the mask and a photoresist pattern for comparison.

In FIG. 1, a mask 10 for forming a black matrix, which is formed on an upper substrate (not shown) opposite to a lower substrate having a pixel electrode and a thin film transistor, includes an edge frame 11 disposed along its edges and a base plate 21 disposed on the edge frame 11. The base plate 21 includes a light-transmitting portion 23 and a light-blocking portion 25. The light-transmitting portion 23 has a size corresponding to a photoresist pattern for the black matrix. The light-blocking portion 25 is disposed between adjacent light-transmitting portions 23 and surrounds each light-transmitting portion 23.

As shown in FIG. 2, the photoresist pattern 30 for the black matrix, which is formed using the mask 10, is larger than the light-transmitting portion 23 of the mask 10. More particularly, the light-transmitting portion 23 of the mask 10 has a first width w1, and the photoresist pattern 30 formed on a substrate (not shown) has a second width w2 wider than the first width w1. The difference between the first width w1 and the second width w2 is referred to as a critical dimension bias.

Recently, as the display device has high definition and high resolution, it is important to form fine photoresist patterns, and the critical dimension of the minimum photoresist pattern is about 7 micrometers due to a decrease in a line width and a limitation in the photo-lithography process.

Thus, if the second width w2 of the photoresist pattern is less than 7 micrometers, the light-transmitting portion 23 can not be formed in the mask 10 considering the critical dimension bias. That is, it is not possible to form the fine photoresist pattern when the second width w2 of the photoresist pattern is less than 7 micrometers.

BRIEF SUMMARY

A mask for forming a black matrix for a display device includes a data line having a bending structure with respect to a central portion of a pixel region includes a edge frame having a rectangular shape, and a base plate disposed on the edge frame and including a light-transmitting portion and a light-blocking portion, wherein the light-transmitting portion includes first light-transmitting patterns and light-controlling portions between adjacent first light-transmitting patterns, and the light-transmitting portion further includes a bending portion corresponding to the central portion of the pixel region, and wherein the bending portion is disposed with a same distance from the light-transmitting patterns adjacent thereto.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE DRAWINGS AND THE PRESENTLY PREFERRED EMBODIMENTS

Reference will now be made in detail to embodiments of the present invention, examples of which are illustrated in the accompanying drawings. Wherever possible, similar reference numbers will be used to refer to the same or similar parts.

Figure 1:
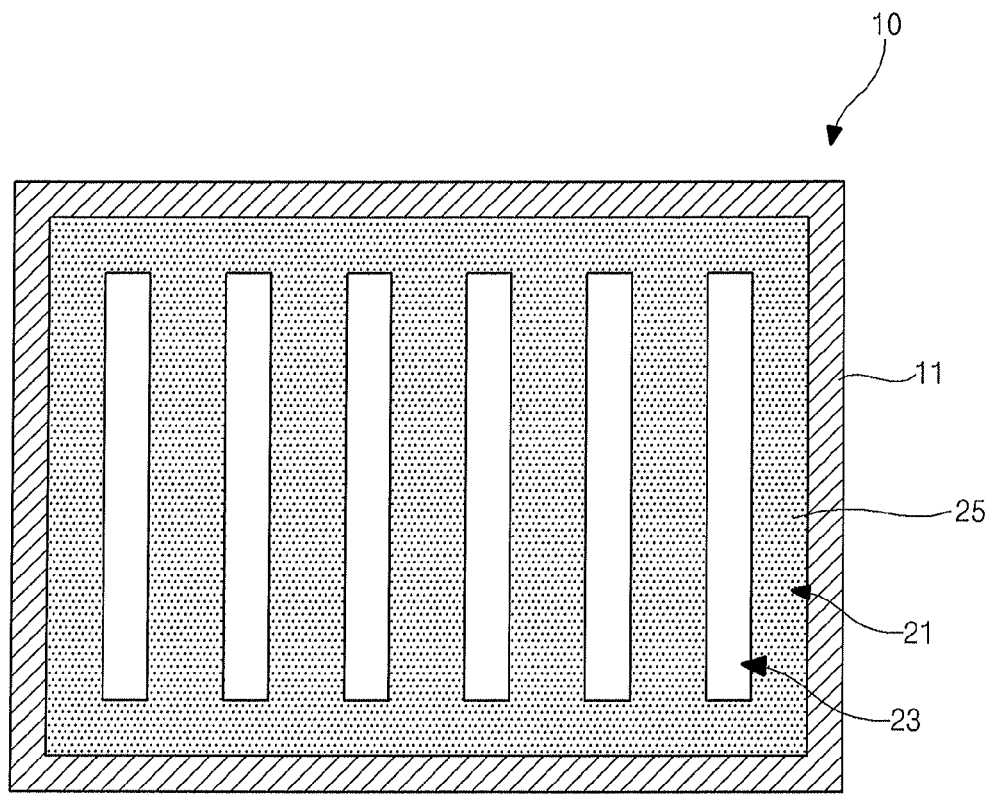
FIG. 1 is a plan view of illustrating a mask for forming a black matrix having a plurality of patterns according to the related art.
Figure 2:
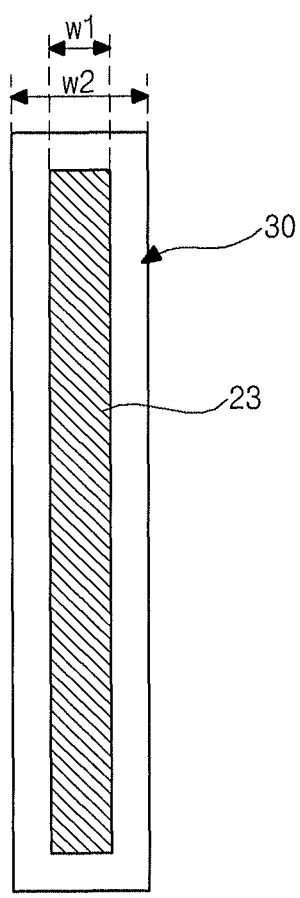
FIG. 2 is a plan view of illustrating a light-transmitting portion of the mask and a photoresist pattern for comparison.
Figure 3A:
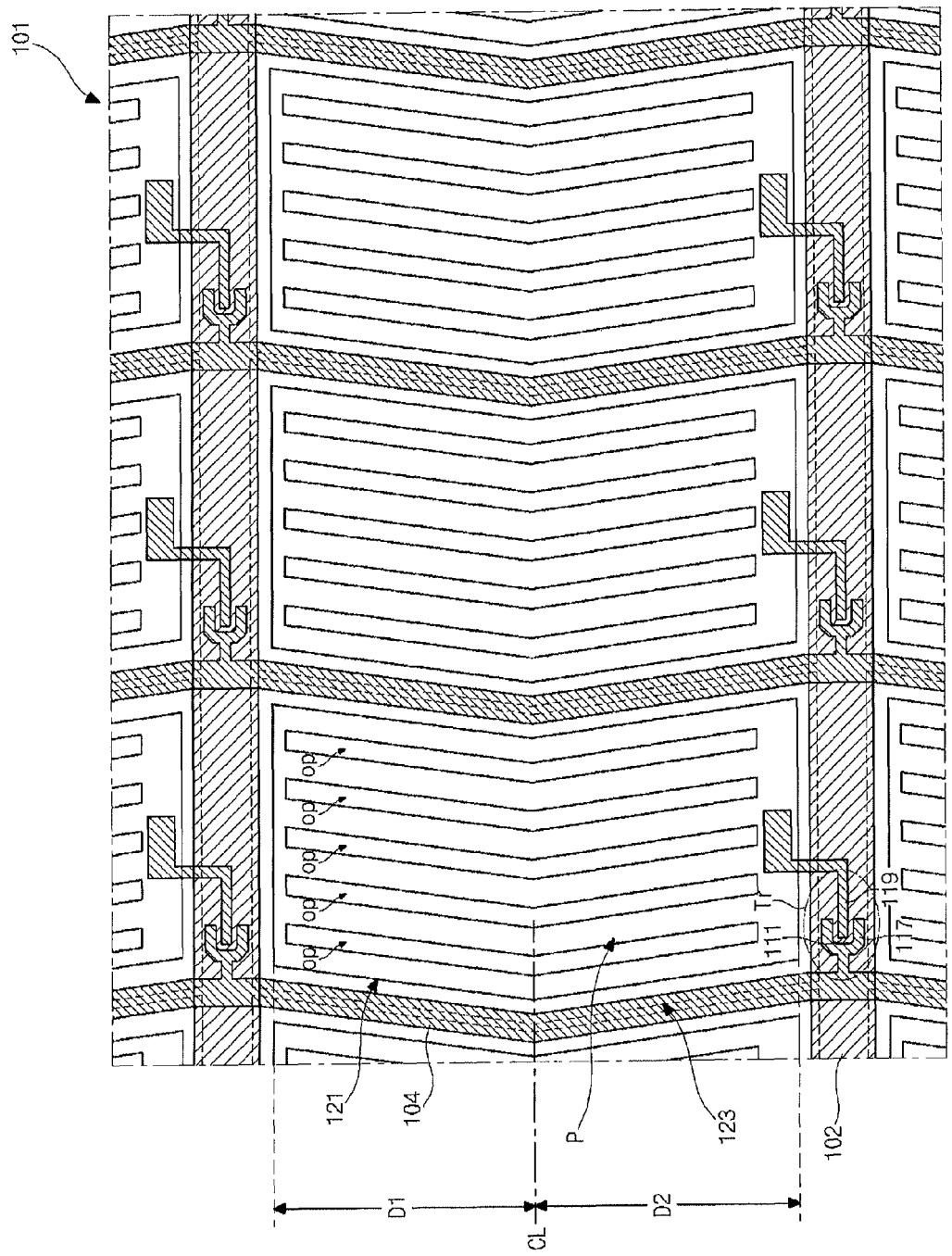
FIG. 3A is a plan view of schematically illustrating an array substrate for a fringe field switching mode liquid crystal display device according to a first embodiment of the present invention.
Figure 3B:
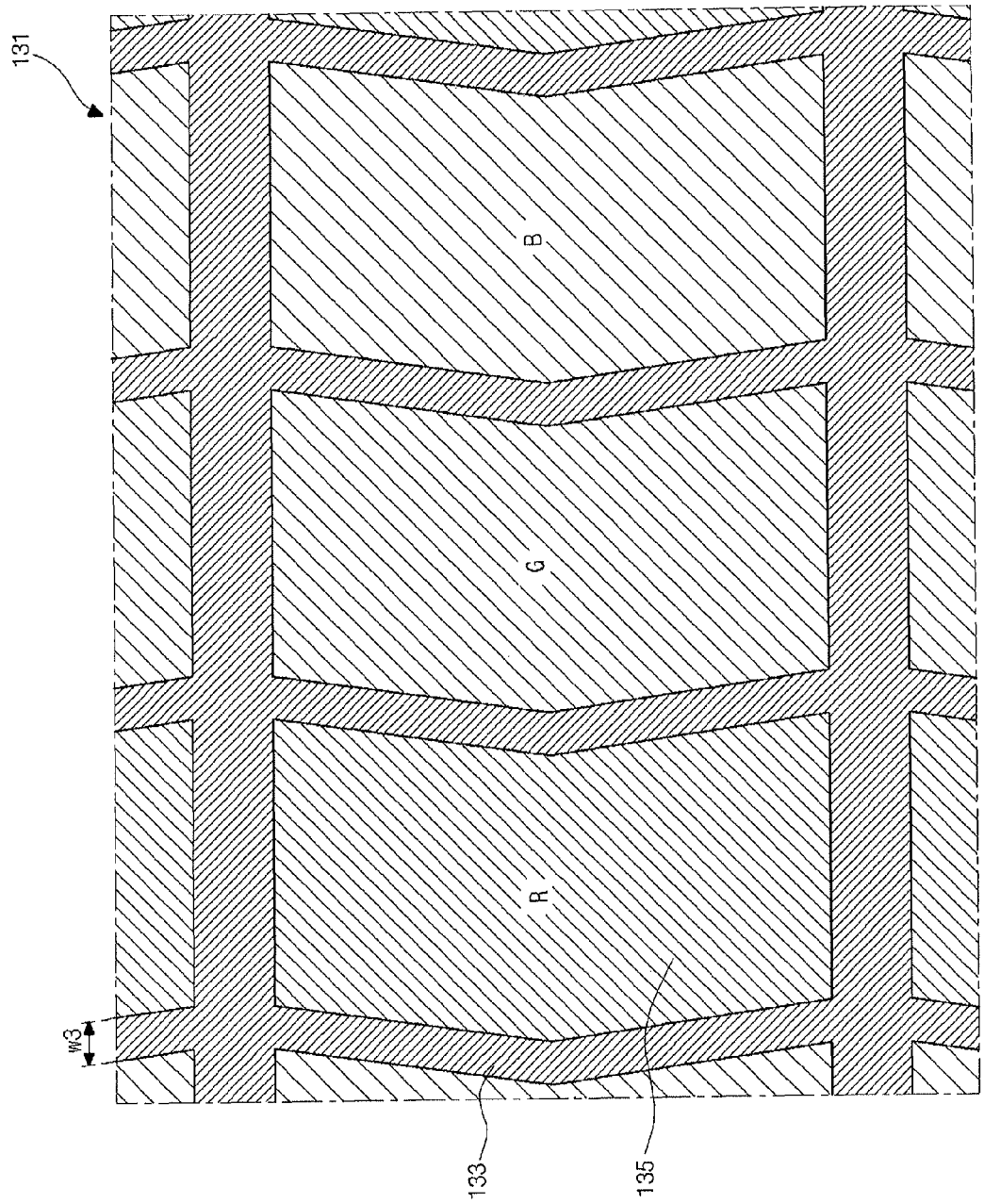
FIG. 3B is a plan view of schematically illustrating a color filter substrate corresponding to the array substrate of FIG. 3A.

FIG. 3A is a plan view of schematically illustrating an array substrate for a fringe field switching mode liquid crystal display device according to a first embodiment of the present invention. FIG. 3B is a plan view of schematically illustrating a color filter substrate for a fringe field switching mode liquid crystal display device according to the first embodiment of the present invention. In the fringe field switching mode device, liquid crystal molecules are driven by an electric field parallel to a substrate as an in-plane switching mode device, and the fringe field switching mode device has the improved aperture ratio and brightness.

As shown in FIG. 3A, in the array substrate 101 for a fringe field switching mode liquid crystal display device of the present invention, gate lines 102 are formed along a first direction, and data lines 104 are formed along a second direction. The data lines 104 cross the gate lines 102 to define pixel regions P.

A thin film transistor Tr is formed in each pixel region P and connected to each gate line 102 and each data line 104. The thin film transistor Tr includes a gate electrode 111, a gate insulating layer (not shown), a semiconductor layer (not shown), a source electrode 117 and a drain electrode 119. The gate electrode 111 is connected to the gate line 102, and the source electrode 117 is connected to the data line 104. The semiconductor layer includes an active layer of intrinsic amorphous silicon and ohmic contact layers of impurity-doped amorphous silicon. The source and drain electrodes 117 and 119 are spaced apart from each other. The semiconductor layer between the source and drain electrodes 117 and 119 becomes a channel of the thin film transistor Tr. Here, the channel of the thin film transistor has a U-like shape, and the shape of the channel of the thin film transistor can be changed.

A pixel electrode 121 is formed in each pixel region P and is connected to the drain electrode 119 of the thin film transistor Tr. A common electrode 123 is formed over the pixel electrode 121 with a passivation layer (not shown) interposed therebetween. The common electrode 123 is formed substantially all over a display area including the pixel regions P and includes openings op corresponding to each pixel region P. The openings op have a bar shape and are spaced apart from each other. Here, even though the common electrode 123 is formed substantially all over the display area, for convenience of explanation, the common electrode 123 is indicated by a dashed line corresponding to the pixel region P.

Meanwhile, the openings op may be formed in the pixel electrode 121, and at this time, the pixel electrode 121 may be formed over the common electrode 123.

Each of the openings op of the common electrode 123 is bent and symmetrical to an imaginary line CL crossing a central portion of the pixel region P parallel to the gate line 102. Namely, one part of each opening op is clockwise inclined by a predetermined angle with respect to a vertical line to the imaginary line CL, and the other part of each opening op is counterclockwise inclined by the predetermined angle with respect to the vertical line to the imaginary line CL. The predetermined angle, beneficially, may be within a range of 7 to 10 degrees. If the predetermined angle is larger than 10 degrees, a driving voltage is increased, and white brightness is reduced in a curve of voltage-transmittance characteristics.

When the openings op of the common electrode 123 are bent and symmetrical to the imaginary line CL crossing the central portion of the pixel region P, the pixel region P has two domains D1 and D2, in which fringe fields of different directions are generated, with respect to the central portion of the pixel region P. Movement of Liquid crystal molecules differs from each other in the domains D1 and D2, and long axes of the liquid crystal molecules are differently arranged in the domains D1 and D2 of the pixel region P. Therefore, color shift is prevented at certain viewing angles.

The first domain D1 may correspond to an upper area of the pixel region P and the second domain D2 may correspond to a lower area of the pixel region P with respect to the central portion of the pixel region P. An angle at which color shift occurs in the first domain D1 differs from an angle at which color shift occurs in the second domain D2, and each domain compensates the color shift in the other domain. Thus, the color shift is prevented.

A color filter substrate 131 is disposed over the array substrate 101 including two domains D1 and D2, and a liquid crystal layer (not shown) is interposed between the array substrate 101 and the color filter substrate 131, thereby constituting a fringe field switching mode liquid crystal display device.

As shown in FIG. 3B, the color filter substrate 131 includes a black matrix 133 and a color filter layer 135. The black matrix 133 has open portions corresponding to the pixel regions P of the array substrate 101. The color filter layer 135 includes red, green and blue color filters sequentially arranged to correspond to the open portions.

An overcoat layer (not shown) is formed over the color filter layer 135.

The black matrix 133 surrounds each of the red, green and blue color filters of the color filter layer 135 and shields the gate line 102, the data line 104 and the thin film transistor Tr of the array substrate 101.

Since the openings op of the common electrode 123 are bent symmetrically to the central portion of the pixel region P and the pixel region P are divided into the two domains D1 and D2, the data line 104 is bent with respect to the central portion of the pixel region P. Therefore, the black matrix 133 is also bent to correspond to the data line 104.

As the display device has high definition and high resolution, the gate line 102 and the data line 104 become minute widths, and the black matrix 133 also needs to have a fine width.

Figure 4A:
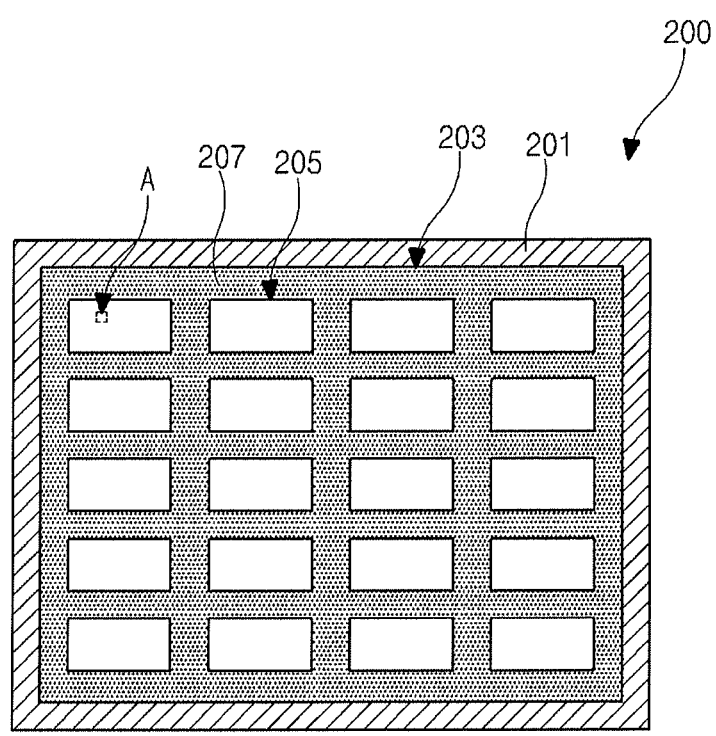
FIG. 4A is a plan view of illustrating a mask for a black matrix of a fringe field switching mode liquid crystal display device having two domains according to the first embodiment of the present invention.
Figure 4B:
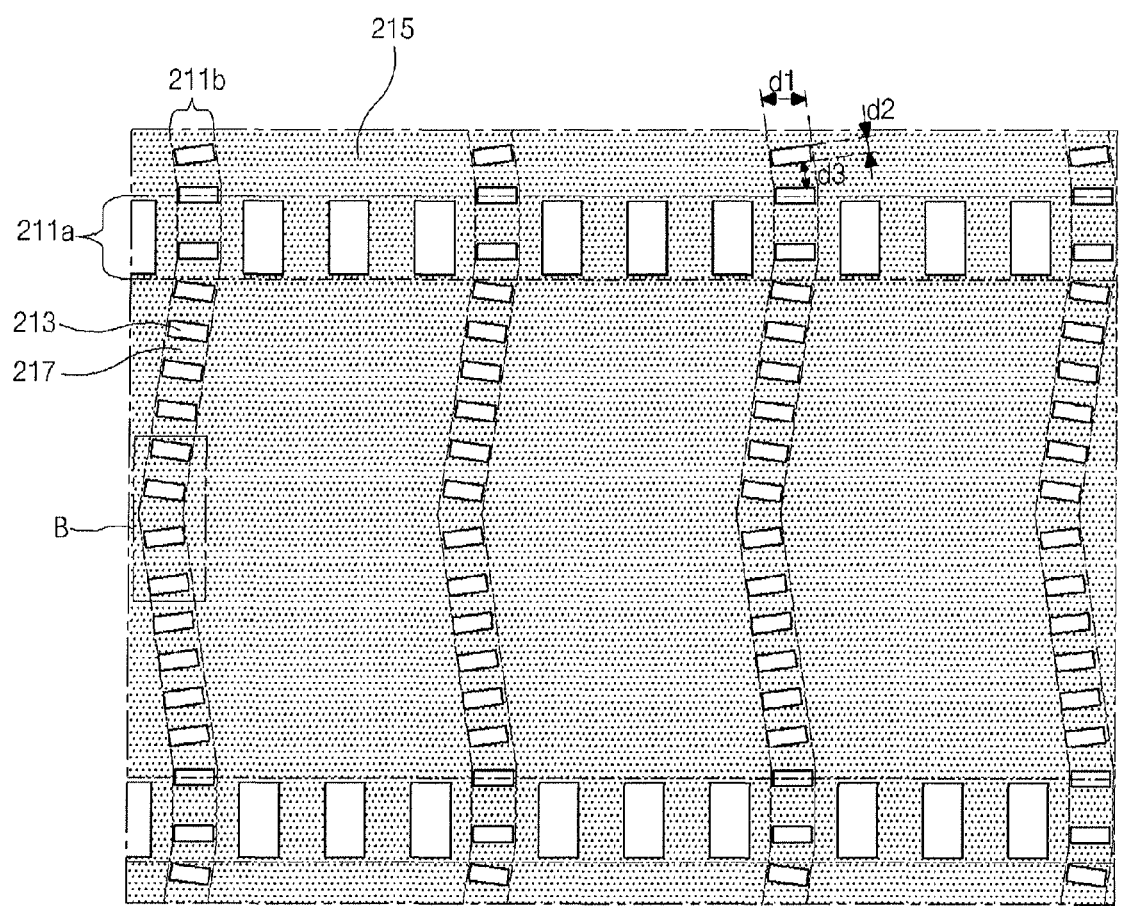
FIG. 4B is a plan view of enlarging a region A of FIG. 4A.
Figure 4C:
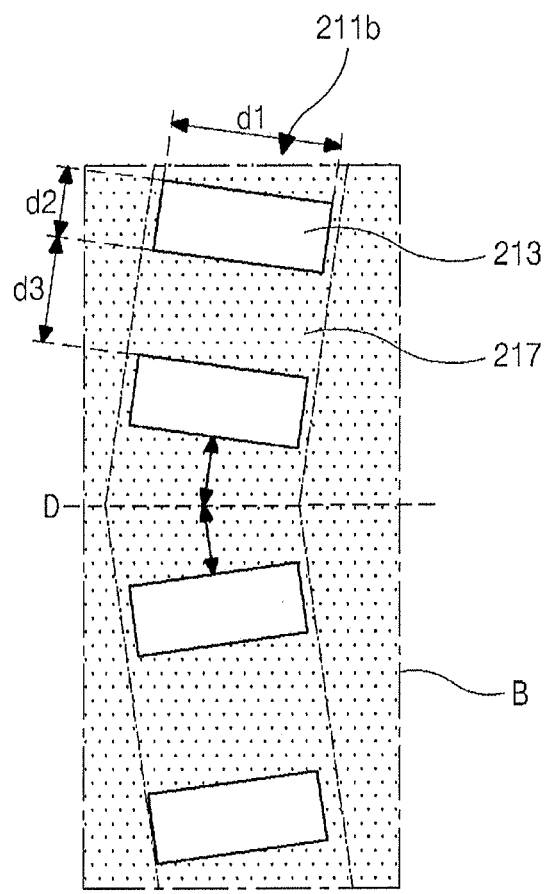
FIG. 4C is a plan view of enlarging a region B of FIG. 4B.
Figure 5A:
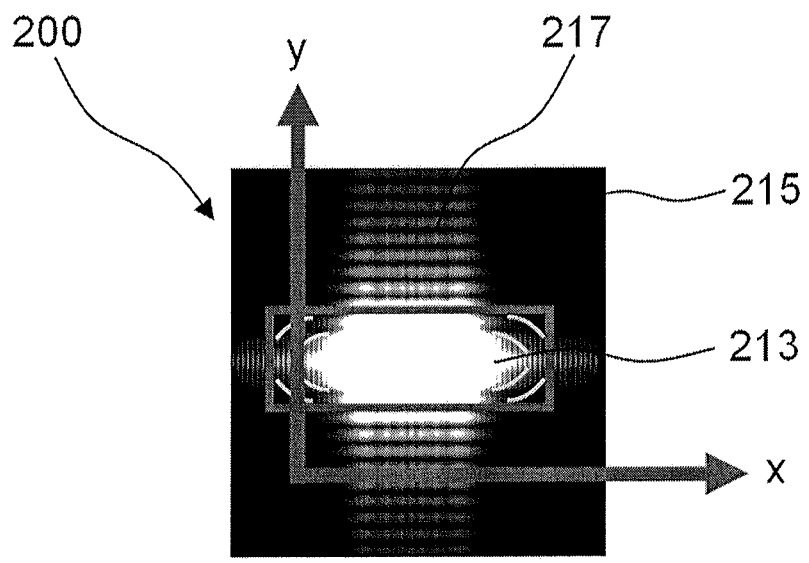
FIGS. 5A and 5B are view of illustrating experimental data of a diffraction phenomenon of a mask according to the first embodiment of the present invention.
Figure 5B:
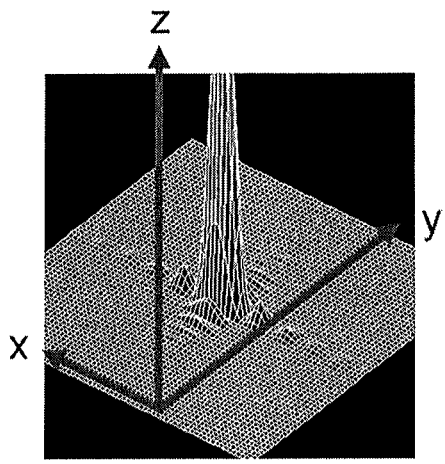

FIG. 4A is a plan view of illustrating a mask for a black matrix of a fringe field switching mode liquid crystal display device having two domains according to the first embodiment of the present invention. FIG. 4B is a plan view of enlarging a region A of FIG. 4A, and FIG. 4C is a plan view of enlarging a region B of FIG. 4B. FIGS. 5A and 5B are view of illustrating experimental data of a diffraction phenomenon of a mask according to the first embodiment of the present invention. FIG. 5A shows light distribution in two dimensions, and FIG. 5B shows light distribution in three dimensions.

In FIG. 4A and FIG. 4B, a mask 200 includes an edge frame 201 and a base plate 203. The edge frame 201 is formed of a metallic material and has a rectangular shape. The base plate 203 is disposed on the edge frame 201. The base plate 203 includes device pattern forming areas 205 and a first light-blocking portion 207. The device pattern forming areas 205 correspond to respective display devices and are spaced apart from each other. The first light-blocking portion 207 is disposed between adjacent device pattern forming areas 205 and surrounds each device pattern forming area 205.

Each device pattern forming area 205 includes first and second light-transmitting portions 211a and 211b and a second light-blocking portion 215. The first and second light-transmitting portions 211a and 211b correspond to the black matrix 133 of FIG. 3B of the color filter substrate 131 of FIG. 3B.

The first light-transmitting portion 211a corresponds to the gate line 102 of FIG. 3A on the array substrate 101 of FIG. 3A. The second light-transmitting portion 211b corresponds to the data line 104 of FIG. 3A on the array substrate 101 of FIG. 3A. Each of the first and second light-transmitting portions 211a and 211b includes first light-transmitting patterns 213 arranged in a predetermined direction and light-controlling portions 217 between adjacent first light-transmitting patterns 213. Here, the first light-transmitting patterns 213 of the first light-transmitting portion 211a may have a larger size than the first light-transmitting patterns 213 of the second light-transmitting portion 211b.

More particularly, the first light-transmitting patterns 213 are sequentially arranged along a length direction of each of the first and second light-transmitting portions 211a and 211b and spaced apart from each other. The light-controlling portions 217 are disposed between adjacent first light-transmitting patterns 213, and the light-controlling portions 217 block light.

When light is irradiated to the mask 200, light diffraction occurs through each of the first light-transmitting patterns 213, and constructive effects on the light diffraction due to the first light-transmitting patterns 213 are caused in the light-controlling portions 217. Thus, photoresist for the black matrix corresponding to the light-controlling portions 217 can be exposed to light.

Therefore, even though the first and second light-transmitting portions 211a and 211b do not have a complete stripe shape, a photoresist pattern of a stripe shape can be obtained due to the constructive effect on the light diffraction in the light-controlling portions 217.

Moreover, the black matrix 133 of FIG. 3B having a stripe shape can be formed by using the photoresist pattern of the stripe shape.

At this time, a shape of the black matrix 133 can be changed by adjusting sizes of the first light-transmitting patterns 213 and the light-controlling portions 217, that is, a length d1 and a width d2 of each first light-transmitting pattern 213 and a width d3 of each light-controlling portion 217. The width d3 of each light-controlling portion 217 corresponds to a distance between adjacent first light-transmitting patterns 213.

Referring to FIG. 5A, the intensity of light is observed around each of the first light-transmitting patterns 213 when ultraviolet is irradiated to a photoresist (not shown) for the black matrix through the mask 200, which includes the first light-transmitting patterns 213 sequentially arranged and the light-controlling portions 217 between adjacent first light-transmitting patterns 213 for forming a photoresist pattern for the black matrix.

In FIG. 5B, the z-axis denotes the intensity of light.

As shown in FIG. 5A and FIG. 5B, the intensity of light passing through the first light-transmitting pattern 213 is strongest, and the intensity of light is weakened as it becomes far from the first light-transmitting pattern 213.

The first light-transmitting patterns 213 are arranged with a long distance therebetween along the x-axis and are arranged with a short distance therebetween, i.e., adjacent to each other along the y-axis. In the light-controlling portions 217 between adjacent first light-transmitting patterns 213 along the y-axis, the intensity of light, which enables the photoresist for the black matrix corresponding to the light-controlling portion 217 to be exposed enough, may be generated due to the constructive effect of the light diffraction.

That is, the constructive effect of the light diffraction occurs to correspond to the light-controlling portions 217, and the intensity of light is enough to expose the photoresist (not shown) for the black matrix corresponding to the light-controlling portions 217.

Accordingly, the photoresist for the black matrix corresponding to the light-controlling portions 217 is exposed to the light. Thus, even though the first and second light-transmitting portions 211a and 211b do not have the complete stripe shape, the black matrix 133 of FIG. 3B having the continuous stripe shape can be formed due to the constructive effect of the light diffraction corresponding to the light-controlling portions 217.

On the other hand, the intensity of light corresponding to the light-controlling portions 217 between the first light-transmitting patterns 213 along the x-axis is not enough to expose the photoresist (not shown) for the black matrix.

Therefore, although there is the critical dimension bias between the light-transmitting portions 211a and 211b of the mask 200 and the photoresist pattern (not shown), the black matrix 133 of FIG. 3B having a minute width w3 of FIG. 3B can be formed.

Here, the width w3 of FIG. 3B of the black matrix 133 of FIG. 3B can be optimized by changing the length d1 and the width d2 of the first light-transmitting pattern 213 and the distance d3 between adjacent first light-transmitting patterns 213.

Namely, the longer the length d1 and the width d2 of the first light-transmitting pattern 213 are, the wider the width w3 of FIG. 3B of the black matrix 133 of FIG. 3B is. On the other hand, the width w3 of FIG. 3B of the black matrix 133 of FIG. 3B decreases as the distance d3 between the first light-transmitting patterns 213 increases.

Meanwhile, the width w3 of FIG. 3B of the black matrix 133 of FIG. 3B may be changed by varying a distance between the substrate 131 of FIG. 3B and the mask 200 or by adjusting the intensity of light irradiated thereto.

In addition, a bending angle of the black matrix 133 of FIG. 3B can be varied by changing an arranging angle of the first light-transmitting patterns 213 of the mask 200.

At this time, as shown in FIG. 4C, a bending portion D perpendicular to a length direction of the light-transmitting portion 211b, beneficially, is formed to have the same distance from each of the first light-transmitting patterns 213 adjacent to each other so that the black matrix 133 of FIG. 3B is bent symmetrically to the central portion of the pixel region P of FIG. 3A according to the first embodiment of the present invention.

That is, the black matrix 133 of FIG. 3B corresponding to the data line 104 of FIG. 3A is formed through the second light-transmitting portion 211b of the mask 200, and the data line 104 of FIG. 3A is bent with respect to the central portion of the pixel region P of FIG. 3A. Since the black matrix 133 of FIG. 3B corresponding to the data line 104 of FIG. 3A is also bent with respect to the central portion of the pixel region P of FIG. 3A, in the second light-transmitting portion 211b of the mask 200 for forming the black matrix corresponding to the data line 104 of FIG. 3B, the bending portion D is formed to correspond to the central portion of the pixel region P of FIG. 3A.

The bending portion D corresponds to the imaginary line CL of FIG. 3A drawn in the central portion of the pixel region P of FIG. 3A parallel to the gate line 102 of FIG. 3A. That is, the second light-transmitting portion 211b of the mask 200 is symmetric to the bending portion D. Here, beneficially, the bending portion D is formed at the same distance from each of the first light-transmitting patterns 213 adjacent thereto so that the second light-transmitting portion 211b including the first light-transmitting patterns 213 may be symmetric with respect to the bending portion D.

Figure 6A:
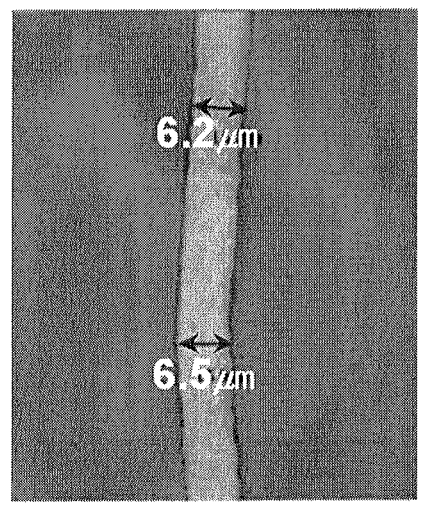
FIG. 6A and FIG. 6B are views of illustrating simulation data of a black matrix that is formed using a mask including first light-transmitting patterns according to the first embodiment of the present invention.
Figure 6B:
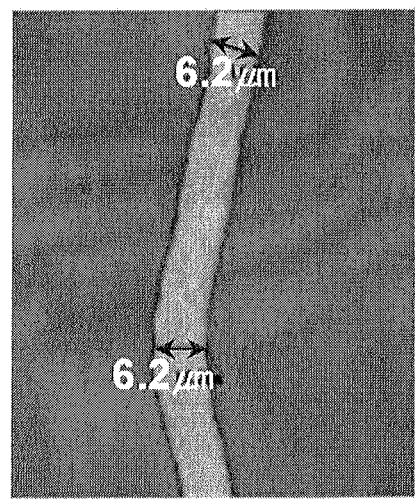

FIG. 6A and FIG. 6B are views of illustrating simulation data of a black matrix that is formed using a mask including first light-transmitting patterns according to the first embodiment of the present invention. FIG. 6A and FIG. 6B show the black matrix, which is formed on the substrate 131 of FIG. 3B using the mask 200 of FIG. 4A including the first light-transmitting patterns 213 of FIG. 4C and the bending portion D of FIG. 4C in the light-transmitting portion 211b of FIG. 4A and is bent by about 5 degrees or about 15 degrees with respect to a vertical direction to the imaginary line CL of FIG. 3A.

In FIG. 6A and FIG. 6B, it is noted that the black matrix 133 of FIG. 3B on the substrate 131 of FIG. 3B has a uniform width w3 of FIG. 3B. It is also noted that the black matrix 133 of FIG. 3B is symmetric to the imaginary line CL of FIG. 3A.

Therefore, to form the black matrix having a bent structure according to the first embodiment of the present invention, the bending portion D of FIG. 4C of the mask 200 of FIG. 4A is formed with the same distance from adjacent first light-transmitting patterns 213 of FIG. 4C, and thus the black matrix 133 of FIG. 3B can have the uniform width w3 of FIG. 3B and have the bent structure symmetrical to each other.

Figure 7A:
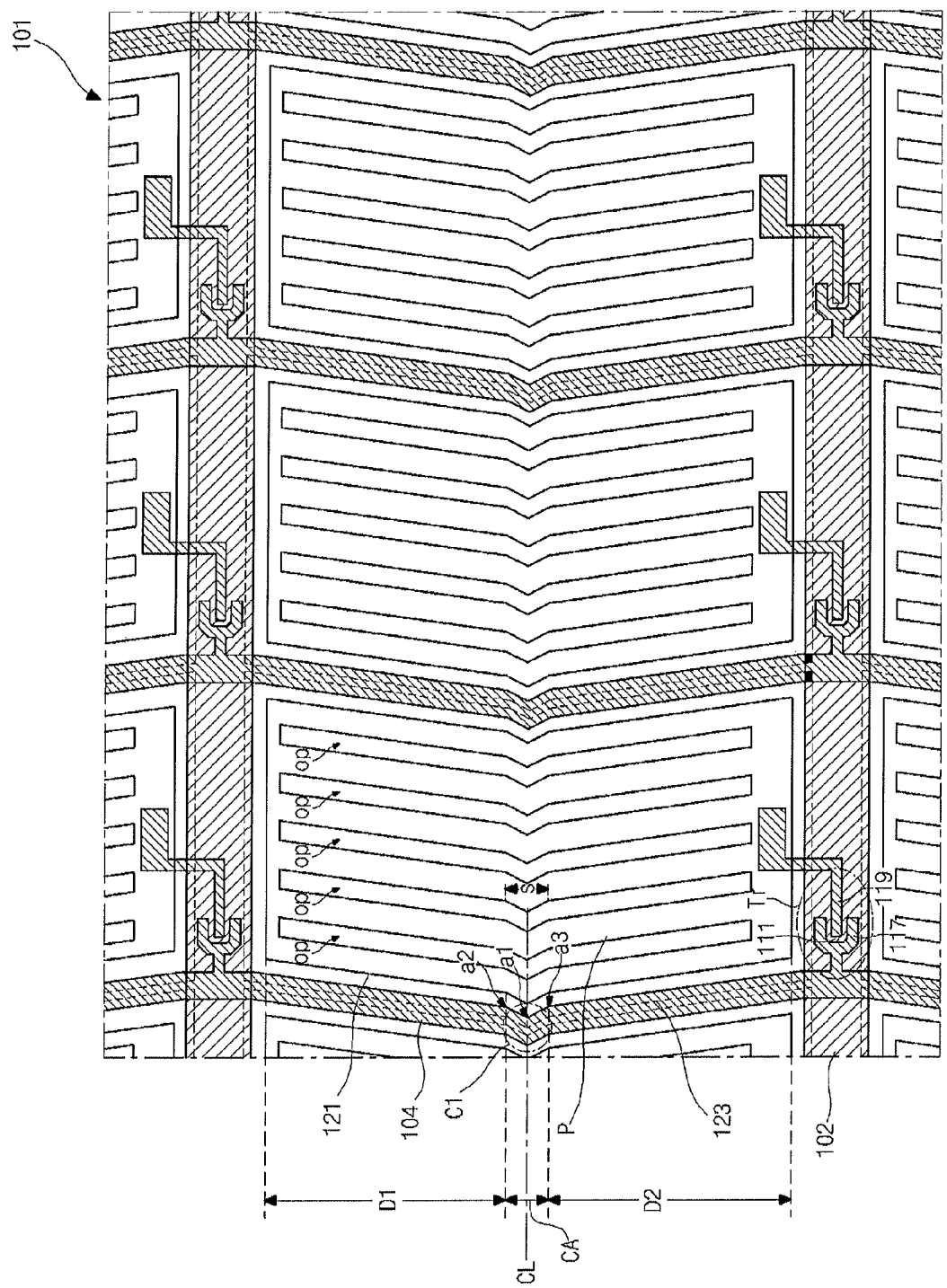
FIG. 7A is a plan view of schematically illustrating an array substrate for a fringe field switching mode liquid crystal display device according to a second embodiment of the present invention.
Figure 7B:
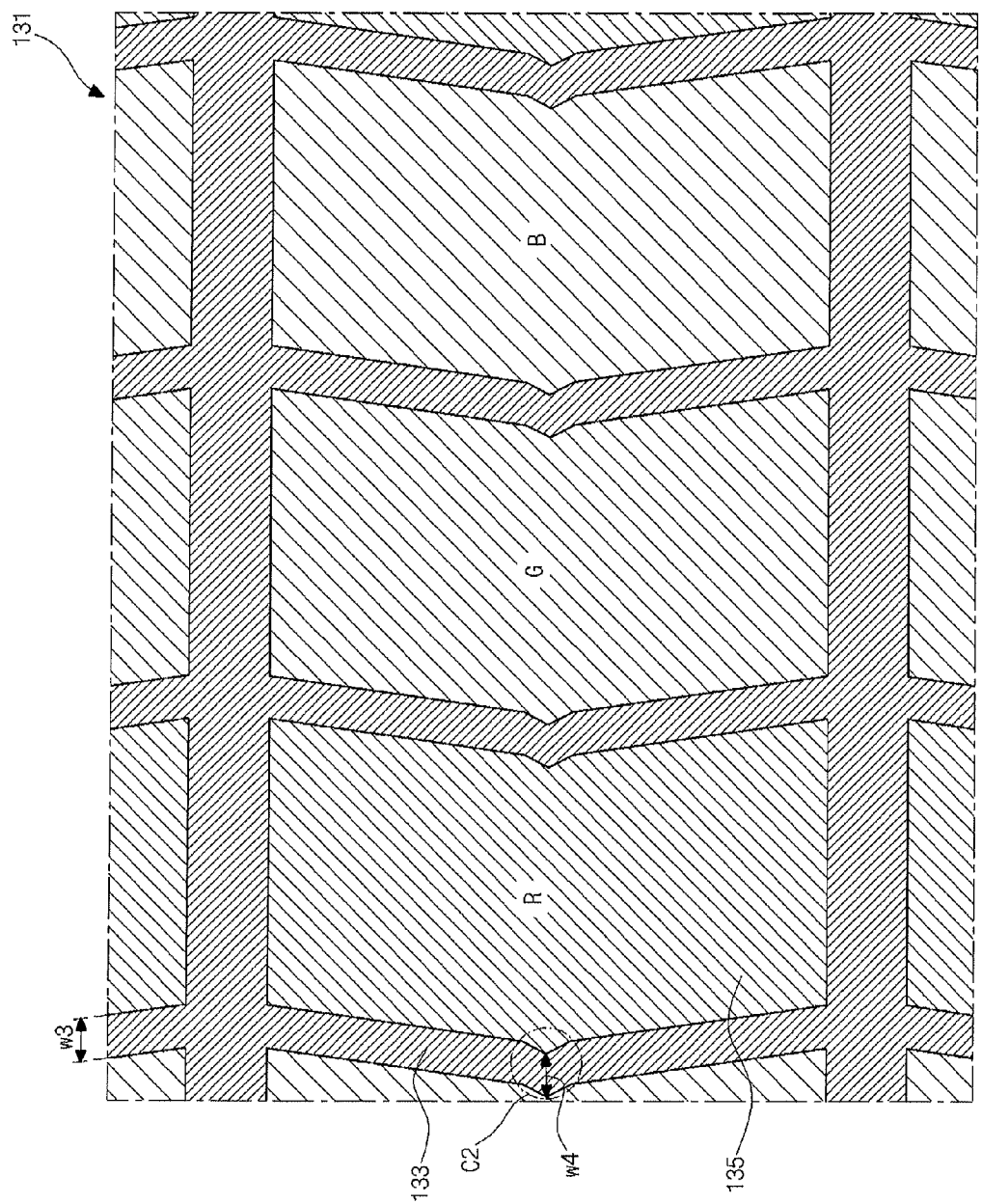
FIG. 7B is a plan view of schematically illustrating a color filter substrate corresponding to the array substrate of FIG. 7A.

FIG. 7A is a plan view of schematically illustrating an array substrate for a fringe field switching mode liquid crystal display device according to a second embodiment of the present invention. FIG. 7B is a plan view of schematically illustrating a color filter substrate corresponding to the array substrate of FIG. 7A. Here, the same reference numbers will be used to refer to the same parts as the first embodiment.

In FIG. 7A, in the array substrate 101 for a fringe field switching mode liquid crystal display device according to the second embodiment of the present invention, gate lines 102 are formed along a first direction, and data lines 104 are formed along a second direction. The data lines 104 cross the gate lines 102 to define pixel regions P.

A thin film transistor Tr is formed in each pixel region P and connected to each gate line 102 and each data line 104. The thin film transistor Tr includes a gate electrode 111, a gate insulating layer (not shown), a semiconductor layer (not shown), a source electrode 117 and a drain electrode 119. The gate electrode 111 is connected to the gate line 102, and the source electrode 117 is connected to the data line 104. The semiconductor layer includes an active layer of intrinsic amorphous silicon and ohmic contact layers of impurity-doped amorphous silicon. The source and drain electrodes 117 and 119 are spaced apart from each other. The semiconductor layer between the source and drain electrodes 117 and 119 becomes a channel of the thin film transistor Tr. Here, the channel of the thin film transistor has a U-like shape, and the shape of the channel of the thin film transistor can be changed.

A pixel electrode 121 is formed in each pixel region P and is connected to the drain electrode 119 of the thin film transistor Tr. A common electrode 123 is formed over the pixel electrode 121 with a passivation layer (not shown) interposed therebetween. The common electrode 123 is formed substantially all over a display area including the pixel regions P and includes openings op corresponding to each pixel region P. The openings op have a bar shape and are spaced apart from each other. Here, even though the common electrode 123 is formed substantially all over the display area, for convenience of explanation, the common electrode 123 is indicated by a dashed line corresponding to the pixel region P.

Meanwhile, the openings op may be formed in the pixel electrode 121, and at this time, the pixel electrode 121 may be formed over the common electrode 123.

Each of the openings op of the common electrode 123 is bent and symmetrical to an imaginary line CL crossing a central portion of the pixel region P parallel to the gate line 102. While each opening op of the first embodiment is bent once with respect to the central portion of the pixel region P, each of the openings op of the second embodiment has first, second and third bending parts a1, a2 and a3. The first bending part a1 corresponds to the central portion of the pixel region P, and the second and third bending parts a2 and a3 are disposed upper and lower area of the first bending part a1 and symmetric to the first bending part a1.

A distance s between the first bending part a1 and the second bending part a2 and between the first bending part a1 and the third bending part a3, beneficially, is within a range of 10 micrometers to 20 micrometers.

A first domain D1 substantially corresponds to an upper region of the second bending part a2 in the pixel region P, and a second domain D2 corresponds to a lower region of the third bending part a3 in the pixel region P in the context of the figure.

A region between the second bending part a2 and the third bending part a3 is a domain boundary region CA.

The openings op of the common electrode 123 are bent and symmetrical to the imaginary line CL crossing the first bending part a1 in the central portion of the pixel region P and being parallel to the gate line 102.

In the domain boundary region CA of the pixel region P, initial arrangement angles of liquid crystal molecules are dominantly different from and symmetric to each other. Even though an outer pressure is applied, it is prevented that initial arrangements of the liquid crystal molecules are the same due to the collapse of the domain boundary.

More particularly, in the first embodiment, a bending angle of the openings op symmetrical to the domain boundary region CA is minimum 160 degrees. The liquid crystal molecules in the openings op are initially arranged with the difference of maximum 20 degrees. Therefore, when the outer pressure is applied, the torque due to the outer pressure is larger than the rotational torque of the liquid crystal molecules, and the liquid crystal molecules are not normally rotated, thereby causing spots.

However, in the second embodiment, the openings op symmetric to the first bending part a1 in the domain boundary region CA, which has a predetermined width s and is disposed in the central portion of the pixel region P, has a bending angle of 120 degrees to 140 degrees. The liquid crystal molecules in the openings op are initially arranged perpendicular to a length direction of the openings op and with the difference of 40 degrees to 60 degrees.

Accordingly, the rotational torque of the liquid crystal molecules increases and becomes larger than the torque due to the outer pressure preventing rotation of the liquid crystal molecules. It is prevented that the liquid crystal molecules are arranged parallel in the first and second domains D1 and D2, and the spots due to the different brightness is restrained.

In the meantime, a color filter substrate 131 is disposed over the array substrate 101 including two domains D1 and D2, and a liquid crystal layer (not shown) is interposed between the array substrate 101 and the color filter substrate 131, thereby constituting a fringe field switching mode liquid crystal display device having two domains D1 and D2.

As shown in FIG. 7B, the color filter substrate 131 includes a black matrix 133 and a color filter layer 135. The black matrix 133 has open portions corresponding to the pixel regions P of the array substrate 101. The color filter layer 135 includes red, green and blue color filters sequentially arranged to correspond to the open portions.

An overcoat layer (not shown) is formed over the color filter layer 135.

Here, the black matrix 133 surrounds each of the red, green and blue color filters of the color filter layer 135 and shields the gate line 102, the data line 104 and the thin film transistor Tr of the array substrate 101.

In the fringe field switching mode liquid crystal display device of the present invention, the openings op of the common electrode 123 have the first, second and third bending parts a1, a2 and a3 with respect to the central portion of the pixel region P, and the data line 104 also has a multiple-bending part C1 with respect to the central portion of the pixel region P.

Thus, a bending part C2 of the black matrix 133 should shield an area for the multiple-bending part C1 of the data line 104, that is, the domain boundary region CA between the second and third bending parts a2 and a3.

Figure 8A:
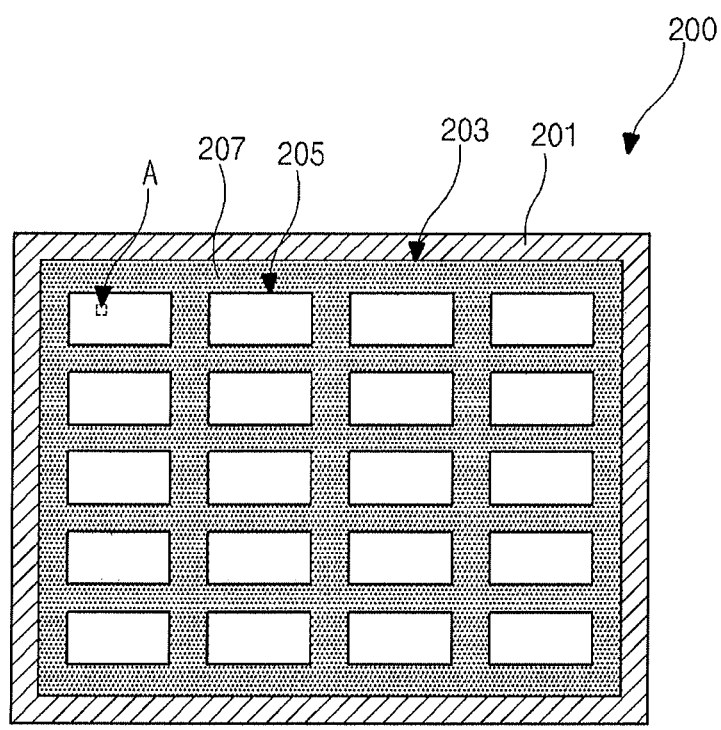
FIG. 8A is a plan view of illustrating a mask for a black matrix of a fringe field switching mode liquid crystal display device having two domains according to the second embodiment of the present invention.
Figure 8B:
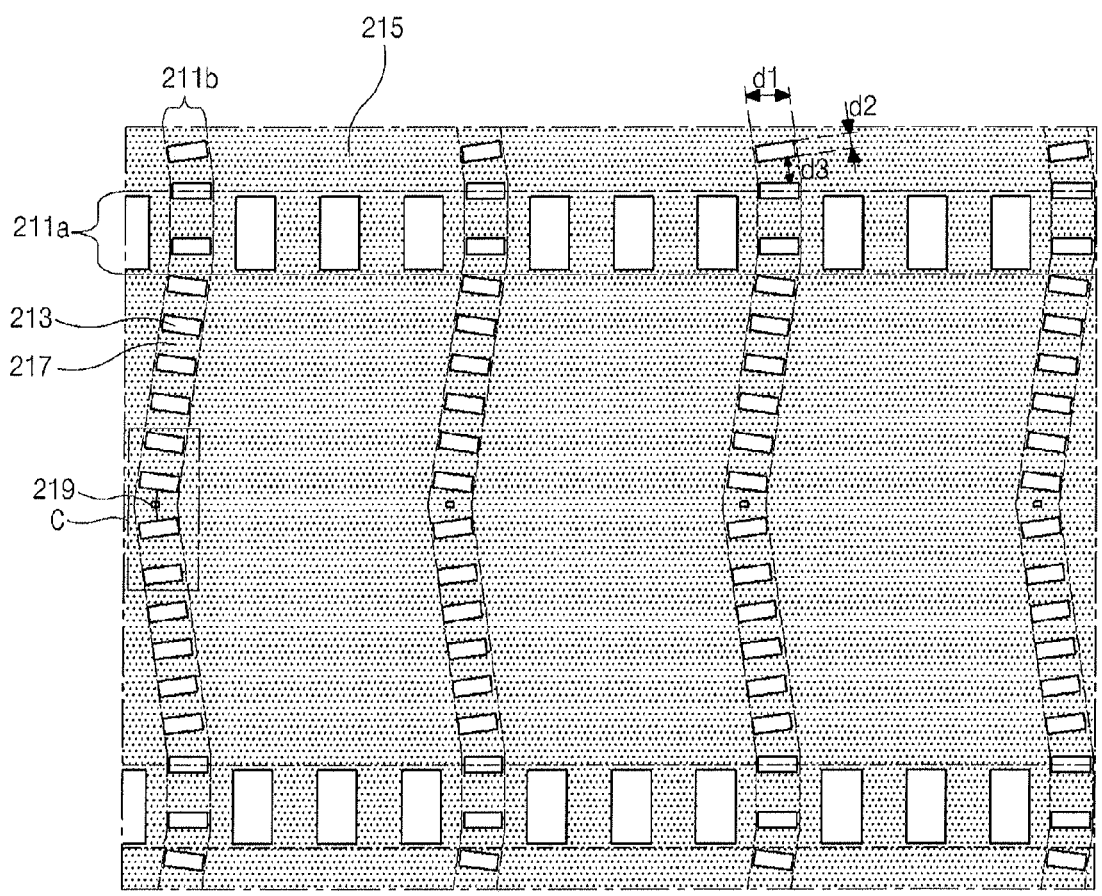
FIG. 8B is a plan view of enlarging a region A of FIG. 8A.
Figure 8C:
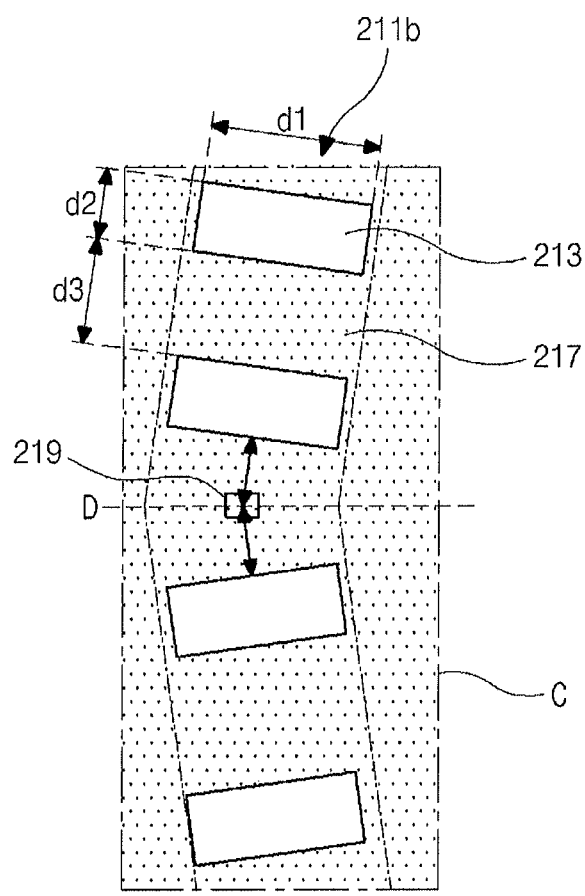
FIG. 8C is a plan view of enlarging a region C of FIG. 8B.

FIG. 8A is a plan view of illustrating a mask for a black matrix of a fringe field switching mode liquid crystal display device having two domains according to the second embodiment of the present invention. FIG. 8B is a plan view of enlarging a region A of FIG. 8A, and FIG. 8C is a plan view of enlarging a region C of FIG. 8B.

In FIG. 8A and FIG. 8B, a mask 200 includes an edge frame 201 and a base plate 203. The edge frame 201 is formed of a metallic material and has a rectangular shape. The base plate 203 is disposed on the edge frame 201. The base plate 203 includes device pattern forming areas 205 and a first light-blocking portion 207. The device pattern forming areas 205 correspond to respective display devices and are spaced apart from each other. The first light-blocking portion 207 is disposed between adjacent device pattern forming areas 205 and surrounds each device pattern forming area 205.

Each device pattern forming area 205 includes first and second light-transmitting portions 211a and 211b and a second light-blocking portion 215. The first and second light-transmitting portions 211a and 211b correspond to the black matrix 133 of FIG. 7B of the color filter substrate 131 of FIG. 7B.

The first light-transmitting portion 211a corresponds to the gate line 102 of FIG. 7A on the array substrate 101 of FIG. 7A. The second light-transmitting portion 211b corresponds to the data line 104 of FIG. 7A on the array substrate 101 of FIG. 7A. Each of the first and second light-transmitting portions 211a and 211b includes first light-transmitting patterns 213 and light-controlling portions 217, and the light-controlling portions 217 are disposed between adjacent first light-transmitting patterns 213. Here, the first light-transmitting patterns 213 of the first light-transmitting portion 211a may have a larger size than the first light-transmitting patterns 213 of the second light-transmitting portion 211b.

More particularly, the first light-transmitting patterns 213 are sequentially arranged along a length direction of each of the first and second light-transmitting portions 211a and 211b and spaced apart from each other. The light-controlling portions 217 are disposed between adjacent first light-transmitting patterns 213, and the light-controlling portions 217 block light.

When light is irradiated to the mask 200, light diffraction occurs through each of the first light-transmitting patterns 213, and the light-controlling portions 217 cause constructive effects on the light diffraction due to the first light-transmitting patterns 213. Thus, photoresist for the black matrix corresponding to the light-controlling portions 217 can be exposed to light.

Therefore, even though the first and second light-transmitting portions 211a and 211b do not have a complete stripe shape, a photoresist pattern of a stripe shape can be obtained due to the constructive effect on the light diffraction from the light-controlling portions 217.

Moreover, the black matrix 133 of FIG. 7B having a continuous stripe shape can be formed by using the photoresist pattern of the stripe shape.

At this time, a shape of the black matrix 133 can be changed by adjusting sizes of the first light-transmitting patterns 213 and the light-controlling portions 217, that is, a length d1 and a width d2 of each first light-transmitting pattern 213 and a width d3 of each light-controlling portion 217. The width d3 of each light-controlling portion 217 corresponds to a distance between adjacent first light-transmitting patterns 213.

Therefore, although there is the critical dimension bias between the light-transmitting portions 211a and 211b of the mask 200 and the photoresist pattern (not shown), the black matrix 133 of FIG. 7B having a minute width w3 of FIG. 7B can be formed.

Here, the width w3 of FIG. 7B of the black matrix 133 of FIG. 7B can be optimized by changing the length d1 and the width d2 of the first light-transmitting pattern 213 and the distance d3 between adjacent first light-transmitting patterns 213.

Namely, the longer the length d1 and the width d2 of the first light-transmitting pattern 213 are, the wider the width w3 of FIG. 7B of the black matrix 133 of FIG. 7B is. On the other hand, the width w3 of FIG. 7B of the black matrix 133 of FIG. 7B decreases as the distance d3 between the first light-transmitting patterns 213 increases.

Meanwhile, the width w3 of FIG. 7B of the black matrix 133 of FIG. 7B may be changed by varying a distance between the substrate 131 of FIG. 7B and the mask 200 or by adjusting the intensity of light irradiated thereto.

In addition, a bending angle of the black matrix 133 of FIG. 7B can be varied by changing an arranging angle of the first light-transmitting patterns 213 of the mask 200.

At this time, as shown in FIG. 8C, a bending portion D perpendicular to a length direction of the light-transmitting portion 211b, beneficially, is formed to correspond the first bending part a1 of FIG. 7A of the opening op of FIG. 7A and to have the same distance from each of the first light-transmitting patterns 213 adjacent to each other so that the black matrix 133 of FIG. 7B shields the domain boundary region CA of FIG. 7A of the pixel region P of FIG. 7A. A second light-transmitting pattern 219 is formed in the bending portion D.

That is, the black matrix 133 of FIG. 7B corresponding to the data line 104 of FIG. 7A is formed through the second light-transmitting portion 211b of the mask 200, and the data line 104 of FIG. 7A is bent with respect to the central portion of the pixel region P of FIG. 7A. Since the black matrix 133 of FIG. 7B corresponding to the data line 104 of FIG. 7A is also bent with respect to the central portion of the pixel region P of FIG. 7A, the second light-transmitting portion 211b of the mask 200 for forming the black matrix 133 of FIG. 7A corresponding to the data line 104 of FIG. 7B has the bending portion D corresponding to the first bending part a1 of FIG. 7A of the opening op of FIG. 7A.

Thus, the second light-transmitting portion 211b of the mask 200 is symmetric to the bending portion D.

Particularly, since the data line 104 of FIG. 7A has the multiple-bending part C1 of FIG. 7A, a width of the multiple-bending part C1 of the data line 104 of FIG. 7A is wider than other parts of the data line 104 of FIG. 7A excluding the multiple-bending part C1. Therefore, a width w4 of FIG. 7B of the bending part C2 of FIG. 7B of the black matrix 133 of FIG. 7B corresponding to the multiple-bending part C1 of FIG. 7A of the data line 104 of FIG. 7A is also wider than the width w3 of other parts of the black matrix 133 of FIG. 7B excluding the bending part C2 of FIG. 7B.

To do this, the second light-transmitting pattern 219 is formed in the bending portion D of the mask 200 according to the second embodiment of the present invention, and the width w4 of FIG. 7B of the bending part C2 of FIG. 7B of the black matrix 133 of FIG. 7B is wider than the width w3 of other parts of the black matrix 133 of FIG. 7B excluding the bending part C2 of FIG. 7B.

The second light-transmitting pattern 219 has a smaller size than the first light-transmitting pattern 213. Desirably, the second light-transmitting pattern 219 may be about ¼ of the size of the first light-transmitting pattern 213. The second light-transmitting pattern 219 has a rectangular shape, and the second light-transmitting pattern 219 may have one of an octagonal shape, a diamond shape, an elliptical shape, a parallelogram shape, a hexagonal shape, a trapezoidal shape, and so on.

The width w4 of FIG. 7B of the bending part C2 of FIG. 7B of the black matrix 133 of FIG. 7B can be adjusted by changing the size of the second light-transmitting pattern 219. In addition, the width w4 of FIG. 7B of the bending part C2 of FIG. 7B of the black matrix 133 of FIG. 7B can be controlled by moving the position of the second light-transmitting pattern 219 along a length direction of the bending portion D, which is parallel to the gate line 102 of FIG. 7A.

Figure 9A:
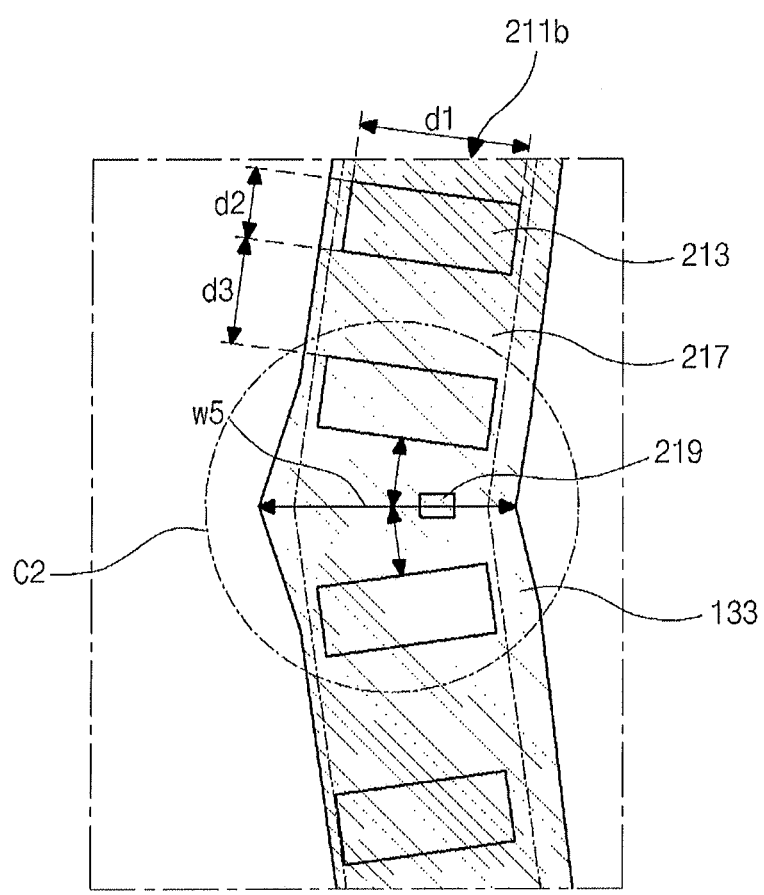
FIG. 9A and FIG. 9B are views of illustrating the width of the bending part of the black matrix depending on the position of the second light-transmitting pattern according to the second embodiment of the present invention.
Figure 9B:
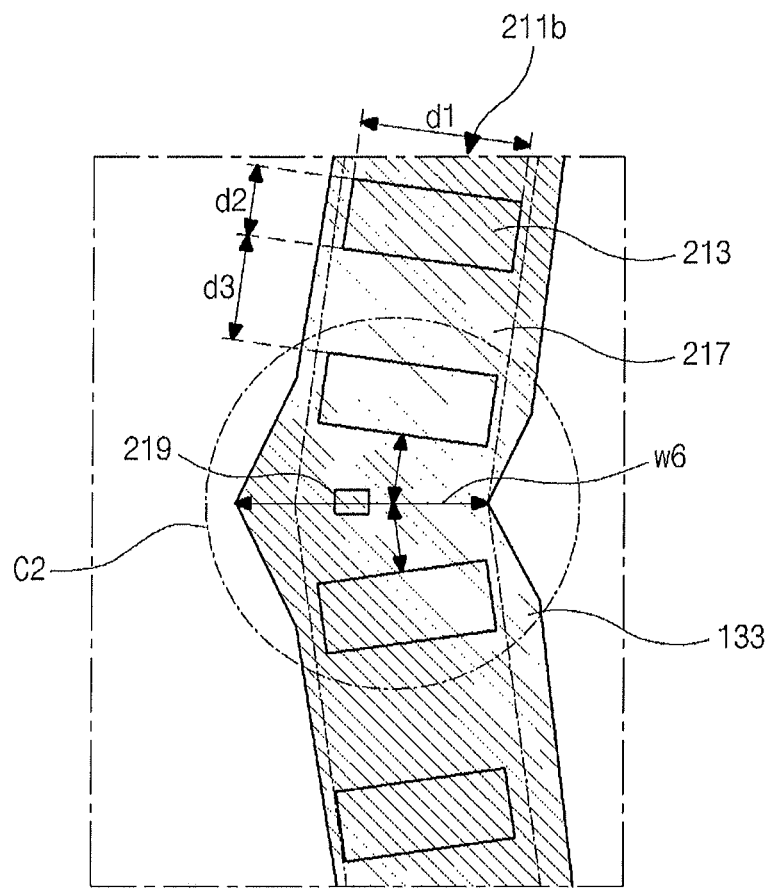

FIG. 9A and FIG. 9B are views of illustrating the width of the bending part of the black matrix depending on the position of the second light-transmitting pattern according to the second embodiment of the present invention.

In FIG. 9A and FIG. 9B, the shape and width of the bending part C2 of the black matrix 133 can be controlled by moving the second light-transmitting pattern 219 with respect to the center of the first light-transmitting pattern 213.

More particularly, as shown in FIG. 9A, when the second light-transmitting pattern 219 is moved left from the center of the first light-transmitting pattern 213 adjacent to the second light-transmitting pattern 219 in the context of the figure, the bending part C2 of the black matrix 133 has a first width w5.

As shown in FIG. 9B, when the second light-transmitting pattern 219 is moved right from the center of the first light-transmitting pattern 213 adjacent to the second light-transmitting pattern 219 in the context of the figure, the bending part C2 of the black matrix 133 is further protruded toward the right side and has a second width w6.

Figure 10A:
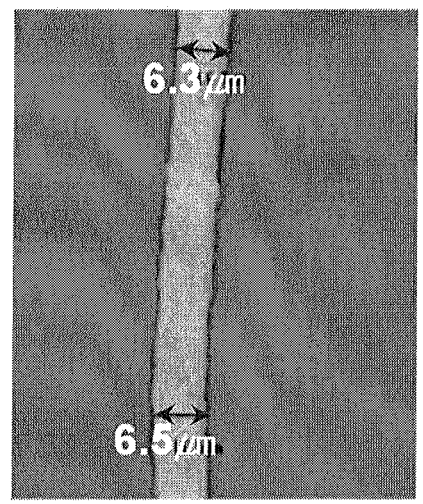
FIG. 10A and FIG. 10B are views of illustrating simulation data of a black matrix that is formed using a mask including first light-transmitting patterns according to the second embodiment of the present invention.
Figure 10B:
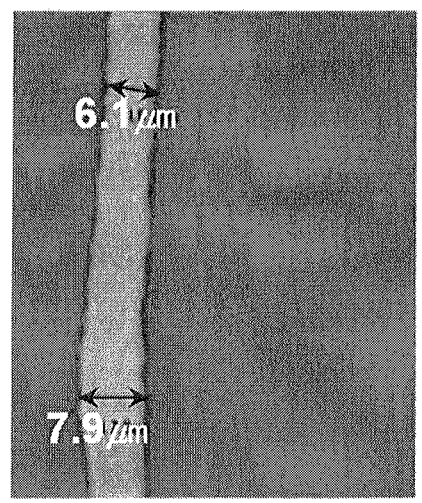

FIG. 10A and FIG. 10B are views of illustrating simulation data of a black matrix that is formed using a mask including first light-transmitting patterns according to the second embodiment of the present invention. FIG. 10A and FIG. 10B show the black matrix, which is formed on the substrate 131 of FIG. 7B using the mask 200 of FIG. 8A including the first light-transmitting patterns 213 of FIG. 8C and the second light-transmitting pattern 219 with the same distance from each of adjacent first light-transmitting pattern 213. In FIG. 10A, the second light-transmitting pattern 219 has a size of 2 micrometers by 2 micrometers, and in FIG. 10B, the second light-transmitting pattern 219 has a size of 3 micrometers by 3 micrometers.

As shown in FIG. 10A and FIG. 10B, the width w4 of the bending part C2 of the black matrix 133 of FIG. 7B is wider than the width w3 of other parts of the black matrix 133 of FIG. 7B excluding the bending part C2 by forming the second light-transmitting pattern 219 of FIG. 8C at the position with the same distance from each of adjacent first light-transmitting patterns 213 of FIG. 8C in the mask 200 of FIG. 8A.

In addition, as the size of the second light-transmitting pattern 219 of FIG. 8C is increased, the width w4 of the bending part C2 of the black matrix 133 of FIG. 7B is widened.

Therefore, to form the black matrix corresponding to the data line 104 of FIG. 7A having the multiple-bending part C1 of FIG. 7A according to the second embodiment of the present invention, the bending portion D of FIG. 8C of the mask 200 of FIG. 8A is formed with the same distance from adjacent first light-transmitting patterns 213 of FIG. 8C, and the second light-transmitting pattern 219 is formed between the adjacent first light-transmitting patterns 213 of FIG. 9C. Accordingly, the width w4 of the bending part C2 of the black matrix 133 of FIG. 7B corresponding to the multiple-bending part C1 of FIG. 7A of the data line 104 of FIG. 7A is wider than the width w3 of other parts of the black matrix 133 of FIG. 7B excluding the bending part C2.

As stated above, in the present invention, the mask 200 of FIG. 8A for the black matrix 133 of FIG. 7B includes the light-transmitting portion 211b of FIG. 8C comprising the plurality of first light-transmitting patterns 213 of FIG. 8C, and the bending portion D is formed with the same distance from each of the adjacent first light-transmitting patterns 213 of FIG. 8C. Although there is the critical dimension bias between the light-transmitting portions 211a and 211b of the mask 200 and the photoresist or black matrix pattern (not shown), the black matrix 133 of FIG. 7B can be formed to have a minute width w3 of FIG. 7B and have a bending structure with respect to the central portion of the pixel region P of FIG. 7A.

Moreover, to form the black matrix 133 of FIG. 7B corresponding to the data line 104 of FIG. 7A having the multiple-bending part C1 of FIG. 7A, the second light-transmitting pattern 219 of FIG. 8C is formed with the same distance from each of the adjacent first light-transmitting patterns 213 of FIG. 8C, and thus the black matrix 133 of FIG. 7B having the bending part C2 of FIG. 7B corresponding to the multiple-bending part C1 of FIG. 7A of the data line 104 of FIG. 7A can be formed.

Here, the black matrix may include a photosensitive resin and be directly formed by being exposed to light through the mask without the photoresist.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A mask for forming a black matrix for a display device that includes a data line having a bending structure with respect to a central portion of a pixel region, comprising:
an edge frame having a rectangular shape; and
a base plate disposed on the edge frame and including a light-transmitting portion and a light-blocking portion,
wherein the light-transmitting portion includes first light-transmitting patterns and light-controlling portions between adjacent first light-transmitting patterns, and the light-transmitting portion includes a bending portion corresponding to the central portion of the pixel region,
wherein the bending portion is disposed at a same distance from the first light-transmitting patterns adjacent thereto,
wherein the first light-transmitting patterns are spaced apart from each other, have their centers defining a centerline, and each of the first light-transmitting patterns is entirely surrounded by the light-controlling portions and the light-blocking portion,
wherein a second light-transmitting pattern is disposed in the bending portion and is smaller than the first light-transmitting patterns,
wherein the second light-transmitting pattern is about ¼ of a size of the first light-transmitting patterns, and
wherein the black matrix includes a second bending structure having a bending width along a gate line direction, the bending width being wider within the central portion of the pixel region, and wherein the bending width is widened by an offset of the second light-transmitting pattern from the centerline of the first light-transmitting patterns along the gate line direction.

2. The mask according to claim 1, wherein light diffraction occurs through the first light-transmitting patterns and constructive effects on the light diffraction are caused in the light-controlling portions.

3. The mask according to claim 1, wherein the data line includes first, second and third bending parts, wherein the first bending part corresponds to the central portion of the pixel region, and the second and third bending parts are spaced apart from the first bending part and symmetric to the first bending part.

4. The mask according to claim 3, wherein a width of the black matrix depends on a size and a position of the second light-transmitting pattern.

5. The mask according to claim 3, wherein the second light-transmitting pattern has one of a rectangular shape, an octagonal shape, a diamond shape, an elliptical shape, a parallelogram shape, a hexagonal shape, and a trapezoidal shape.

6. The mask according to claim 1, wherein a width of the black matrix depends on a length and a width of the first light-transmitting patterns and a distance between adjacent first light-transmitting patterns.

7. The mask according to claim 6, wherein the width of the black matrix increases as the length and the width of the first light-transmitting patterns increase, and the width of the black matrix decreases as the distance between adjacent first light-transmitting patterns increases.

8. The mask according to claim 1, wherein a width of the black matrix depends on a distance between a substrate for forming the black matrix and the mask.

9. The mask according to claim 1, wherein a bending angle of the black matrix depends on an arrangement angle of the first light-transmitting patterns.

* * * * *